(12) United States Patent
Twitchen et al.

(10) Patent No.: US 8,110,041 B2
(45) Date of Patent: *Feb. 7, 2012

(54) COLOURED DIAMOND

(76) Inventors: Daniel James Twitchen, Sunningdale (GB); Philip Maurice Martineau, Littlewick Green (GB); Geoffrey Alan Scarsbrook, Ascot (GB)

( * ) Notice: Subject to any disclaimer, the term of this patent is extended or adjusted under 35 U.S.C. 154(b) by 114 days.

This patent is subject to a terminal disclaimer.

(21) Appl. No.: 12/416,216

(22) Filed: Apr. 1, 2009

(65) Prior Publication Data

US 2009/0291287 A1      Nov. 26, 2009

Related U.S. Application Data

(63) Continuation of application No. 11/610,519, filed on Dec. 14, 2006, now abandoned, which is a continuation of application No. 10/655,040, filed on Sep. 5, 2003, now Pat. No. 7,172,655.

(30) Foreign Application Priority Data

Sep. 6, 2002   (GB) .................................. 0220772.8
Feb. 21, 2003  (GB) .................................. 0304029.2

(51) Int. Cl.
    *C30B 29/02*       (2006.01)

(52) U.S. Cl. ................... 117/2; 117/3; 117/89; 117/929
(58) Field of Classification Search ................ 117/2, 3, 117/89, 4, 929
    See application file for complete search history.

(56) References Cited

U.S. PATENT DOCUMENTS 3,134,739 A    5/1964   Cannon
3,141,855 A    7/1964   Wentorf, Jr.
(Continued)

FOREIGN PATENT DOCUMENTS

CA    2 382 785 A1    3/2001
(Continued)

OTHER PUBLICATIONS

U.S. Appl. No. 10/318,111, filed Dec. 13, 2002, Scarsbrook et al.
(Continued)

*Primary Examiner* — Bob M Kunemund
(74) *Attorney, Agent, or Firm* — Oblon, Spivak, McClelland, Maier & Neustadt, L.L.P.

(57) ABSTRACT

A method of producing a single crystal CVD diamond of a desired color which includes the steps of providing single crystal CVD diamond which is colored and heat treating the diamond under conditions suitable to produce the desired color. Colors which may be produced are, for example, in the pink-green range.

14 Claims, 5 Drawing Sheets

U.S. PATENT DOCUMENTS

| | | | |
|---|---|---|---|
| 4,124,690 | A | 11/1978 | Strong et al. |
| 4,174,380 | A | 11/1979 | Strong et al. |
| 4,181,505 | A | 1/1980 | De Vries et al. |
| 4,399,364 | A | 8/1983 | Evans et al. |
| 4,874,398 | A | 10/1989 | Ringwood |
| 4,880,613 | A | 11/1989 | Satoh et al. |
| 4,948,388 | A | 8/1990 | Ringwood |
| 4,950,463 | A | 8/1990 | Satoh et al. |
| 4,959,201 | A | 9/1990 | Satoh et al. |
| 4,985,051 | A | 1/1991 | Ringwood |
| 5,451,430 | A | 9/1995 | Anthony et al. |
| 5,523,071 | A | 6/1996 | Jackson et al. |
| 5,672,395 | A | 9/1997 | Anthony et al. |
| 6,007,916 | A | 12/1999 | Satoh et al. |
| 6,129,900 | A | 10/2000 | Satoh et al. |
| 6,377,340 | B1 | 4/2002 | Anthony et al. |
| 6,582,513 | B1 | 6/2003 | Linares et al. |
| 6,692,714 | B2 | 2/2004 | Vagarali et al. |
| 6,811,610 | B2 | 11/2004 | Frushour et al. |
| 7,115,241 | B2 | 10/2006 | Hemley et al. |
| 7,128,974 | B2 | 10/2006 | Scarsbrook et al. |
| 7,160,617 | B2 | 1/2007 | Scarsbrook et al. |
| 7,172,655 | B2 | 2/2007 | Twitchen et al. |
| 7,175,704 | B2 | 2/2007 | D'Evelyn et al. |
| 7,241,434 | B2 | 7/2007 | Anthony et al. |
| 7,309,477 | B2 | 12/2007 | Hemley et al. |
| 7,323,156 | B2 | 1/2008 | Vagarali et al. |
| 7,594,968 | B2 | 9/2009 | Hemley et al. |
| 2001/0031237 | A1 | 10/2001 | Vagarali et al. |
| 2002/0081260 | A1 | 6/2002 | Vagarali et al. |
| 2002/0172638 | A1 | 11/2002 | Vagarali et al. |
| 2003/0143150 | A1 | 7/2003 | Vagarali et al. |
| 2003/0230232 | A1 | 12/2003 | Frushour et al. |
| 2004/0000266 | A1 | 1/2004 | D'Evelyn et al. |
| 2004/0146451 | A1 | 7/2004 | Vagarali et al. |
| 2004/0175499 | A1 | 9/2004 | Twitchen et al. |
| 2004/0177803 | A1 | 9/2004 | Scarsbrook et al. |
| 2004/0180205 | A1 | 9/2004 | Scarsbrook et al. |
| 2004/0182308 | A1 | 9/2004 | Scarsbrook et al. |
| 2004/0194690 | A1 | 10/2004 | Twitchen et al. |
| 2004/0221795 | A1 | 11/2004 | Scarsbrook et al. |
| 2004/0229464 | A1 | 11/2004 | Godfried et al. |
| 2005/0025886 | A1 | 2/2005 | Hemley et al. |
| 2005/0249655 | A1 | 11/2005 | Vagarali et al. |
| 2005/0260935 | A1 | 11/2005 | Anthony et al. |
| 2006/0065187 | A1 | 3/2006 | Hemley et al. |
| 2006/0096521 | A1 | 5/2006 | D'Evelyn et al. |
| 2006/0144322 | A9 | 7/2006 | Hemley et al. |
| 2006/0177962 | A1 | 8/2006 | Namba et al. |
| 2006/0185583 | A1 | 8/2006 | Hemley et al. |
| 2007/0053823 | A1 | 3/2007 | Vins |
| 2007/0054124 | A1 | 3/2007 | Gill et al. |
| 2007/0079752 | A1 | 4/2007 | Twitchen et al. |
| 2007/0212543 | A1 | 9/2007 | Twitchen et al. |
| 2007/0290408 | A1 | 12/2007 | Hemley et al. |
| 2008/0073646 | A1 | 3/2008 | Khan |
| 2008/0134959 | A1 | 6/2008 | Kasu et al. |
| 2008/0134960 | A1 | 6/2008 | Kasu et al. |
| 2008/0217626 | A1 | 9/2008 | Kasu et al. |
| 2008/0241049 | A1 | 10/2008 | Hemley et al. |
| 2009/0127506 | A1 | 5/2009 | Twitchen et al. |
| 2009/0258229 | A1 | 10/2009 | Summerton et al. |
| 2009/0261347 | A1 | 10/2009 | Kasu et al. |
| 2010/0015438 | A1 | 1/2010 | Williams et al. |

FOREIGN PATENT DOCUMENTS

| | | |
|---|---|---|
| CA | 2 405 409 A1 | 10/2001 |
| CA | 2 405 362 C | 8/2008 |
| CA | 2 405 420 C | 8/2008 |
| CA | 2 405 409 C | 11/2009 |
| CA | 2 495 840 C | 2/2011 |
| DE | 1 168 396 | 4/1964 |
| DE | 25 19 116 A1 | 12/1975 |
| DE | 27 32 793 A1 | 1/1978 |
| DE | 600 27 441 T2 | 12/2006 |
| DE | 601 23 591 T2 | 8/2007 |
| DE | 601 23 592 T2 | 8/2007 |
| DE | 601 23 593 T2 | 8/2007 |
| DE | 11 2007 001 892 T5 | 6/2009 |
| EP | 0 014 528 A1 | 8/1980 |
| EP | 0 014 528 B1 | 3/1983 |
| EP | 0 275 063 A2 | 7/1988 |
| EP | 0 316 856 A1 | 5/1989 |
| EP | 0 324 179 A1 | 7/1989 |
| EP | 0 191 067 B1 | 1/1992 |
| EP | 0 324 179 B1 | 10/1992 |
| EP | 0 589 464 A1 | 3/1994 |
| EP | 0 615 954 A1 | 9/1994 |
| EP | 0 638 670 A1 | 2/1995 |
| EP | 0 668 377 A1 | 8/1995 |
| EP | 0 671 482 A1 | 9/1995 |
| EP | 0 715 885 A2 | 6/1996 |
| EP | 0 879 904 A1 | 11/1998 |
| EP | 0 638 670 B1 | 5/2001 |
| EP | 1 378 591 A1 | 1/2004 |
| EP | 1 637 218 A2 | 3/2006 |
| EP | 1 210 171 B1 | 4/2006 |
| EP | 1 645 328 A1 | 4/2006 |
| EP | 1 645 664 A1 | 4/2006 |
| EP | 1 272 264 B1 | 10/2006 |
| EP | 1 272 265 B1 | 10/2006 |
| EP | 1 272 266 B1 | 10/2006 |
| EP | 1 315 558 B1 | 10/2006 |
| EP | 1 713 116 A1 | 10/2006 |
| EP | 1 715 086 A1 | 10/2006 |
| EP | 1 895 579 A1 | 3/2008 |
| FR | 1.341.561 | 9/1963 |
| FR | 2 275 405 A1 | 1/1976 |
| FR | 2 359 071 A1 | 2/1978 |
| GB | 1014226 | 12/1965 |
| GB | 1 500 817 | 2/1978 |
| GB | 1 578 987 | 11/1980 |
| GB | 2 428 690 A | 2/2007 |
| GB | 2 430 194 A | 3/2007 |
| GB | 2 432 592 A | 5/2007 |
| GB | 2 433 737 A | 7/2007 |
| GB | 2 433 738 A | 7/2007 |
| JP | 55-126521 | 9/1980 |
| JP | 63-291896 A | 11/1988 |
| JP | 64-20689 A | 1/1989 |
| JP | 1-124402 A | 5/1989 |
| JP | 1-131014 | 5/1989 |
| JP | 1-183409 A | 7/1989 |
| JP | 1-246196 | 10/1989 |
| JP | 2-385 A | 1/1990 |
| JP | 2-18980 A | 1/1990 |
| JP | 2-22877 | 1/1990 |
| JP | 6-107494 | 4/1994 |
| JP | 6-263418 | 9/1994 |
| JP | 7-165494 A | 6/1995 |
| JP | 7-277890 | 10/1995 |
| JP | 7-331441 A | 12/1995 |
| JP | 8-2997 A | 1/1996 |
| JP | 9-164329 A | 6/1997 |
| JP | 9-165295 | 6/1997 |
| JP | 11-1392 | 1/1999 |
| JP | 2004-161604 A | 6/2004 |
| JP | 2007-15918 A | 1/2007 |
| KR | 10-2004-0042576 A | 5/2004 |
| RU | 2 237 113 C1 | 9/2004 |
| RU | 2 281 350 C2 | 8/2006 |
| TW | 548351 | 8/2003 |
| WO | WO 86/01433 A1 | 3/1986 |
| WO | WO 01/14050 A | 3/2001 |
| WO | 01/72404 A1 | 10/2001 |
| WO | 01/72406 A1 | 10/2001 |
| WO | WO 01/72405 A1 | 10/2001 |
| WO | 01/96634 A1 | 12/2001 |
| WO | WO 02/13958 A2 | 2/2002 |
| WO | 03/040440 A2 | 5/2003 |
| WO | WO 2004/022821 A1 | 3/2004 |
| WO | WO 2004/046427 A1 | 6/2004 |
| WO | WO 2004/074557 A1 | 9/2004 |
| WO | WO 2004/113597 A1 | 12/2004 |
| WO | WO 2005/007936 A2 | 1/2005 |
| WO | WO 2005/007936 A3 | 1/2005 |

| | | | |
|---|---|---|---|
| WO | WO 2005/007937 A2 | 1/2005 |
| WO | WO 2005/007937 A3 | 1/2005 |
| WO | WO 2005/031033 A1 | 4/2005 |
| WO | WO 2005/041279 A1 | 5/2005 |
| WO | WO 2006/061707 A2 | 6/2006 |
| WO | WO 2006/061707 A3 | 6/2006 |
| WO | WO 2006/136929 A2 | 12/2006 |
| WO | WO 2006/136929 A3 | 12/2006 |
| WO | WO 2006/137401 A1 | 12/2006 |
| WO | WO 2007/018555 A2 | 2/2007 |
| WO | WO 2007/018555 A3 | 2/2007 |
| WO | WO 2007/066215 A2 | 6/2007 |
| WO | WO 2007/066215 A3 | 6/2007 |
| WO | WO 2008/019404 A2 | 2/2008 |
| WO | WO 2008/019404 A3 | 2/2008 |

OTHER PUBLICATIONS

U.S. Appl. No. 12/899,611, filed Oct. 7, 2010, Twitchen, et al.

P. Kania, et al., Diamond and Related Materials, vol. 4, pp. 425-428 (1995).

English translation of "Characterization of thick homoepitaxial film on diamond (001) substrate II".

English translation of "Homoepitaxial growth of diamond (001) with nitrogen doping".

J. Michler, et al., J. Appl. Phys., vol. 83, No. 1, pp. 187-197 (1998).

R. Locher, et al., Appl. Phys. Lett., vol. 65, No. 1, pp. 34-36 (1994).

I.I. Vlasov, et al., Phys. Stat. Sol, vol. (a)181, No. 83, pp. 83-90 (2000).

P.E. Pehrsson, et al., Mat. Res. Soc. Symp, Proc., vol. 416, pp. 51-56 (1996).

A.T. Collins, et al., Diamond and Related Material, vol. 9, pp. 113-122 (2000).

Y. Zhizhong, Abstract of article on "Colour-treated Yellowish-green Diamond under High Pressure and Temperature", p. 35.

Taiwanese Office Action and Search Report issued on Jun. 17, 2009 in corresponding Taiwanese Application No. 092125957 (with an English Translation of the Search Report).

Dr. Karl Schmetzer, "High Pressure High Temperature Treatment of Diamonds—A Review of the Patent Literature from Five Decades (1960-2009)", The Journal of Gemmology, vol. 32, No. 1-4, 2010, 28 Pages.

Jin-Long Liang et al., "Optimization and Identification of Diamonds", Google Scholar, Jewry Technology, 1999, 1 Page.

Hou-Xiang Liu, "Causes Associated with the Color of Diamonds and Artificial Change of the Color", Google Scholar, Chinese Jewry, 1996, 3 Pages.

COLOURED DIAMOND

This is a continuation application of U.S. application Ser. No. 11/610,519, filed Dec. 14, 2006, which is a continuation application of U.S. application Ser. No. 10/655,040, filed Sep. 5, 2003.

BACKGROUND OF THE INVENTION

This invention relates to a method of producing coloured diamond and more particularly coloured single crystal chemical vapour deposition (hereinafter referred to as CVD) diamond that is suitable, for example, for ornamental purposes.

Intrinsic diamond has an indirect band gap of 5.5 eV and is transparent in the visible part of the spectrum. Introducing defects or colour centres, as they will be called hereinafter, which have, associated energy levels within the band gap gives the diamond a characteristic colour that is dependent on the type and concentration of the colour centres. This colour can result from either absorption or photoluminescence or some combination of these two. One example of a common colour centre present in synthetic diamond is nitrogen which, when on a substitutional lattice site in the neutral charge state, has an associated energy level ~1.7 eV below the conduction band—the resulting absorption gives the diamond a characteristic yellow/brown colour.

It is well known that post-growth treatment of diamond, such as irradiation with sufficiently energetic particles or radiation (electron, neutron, gamma etc) to produce lattice defects (interstitials and vacancies) and suitable subsequent annealing, can result in the formation of colour centres such as the nitrogen vacancy [N-V] colour centre which can give the diamond a desirable colour (see for example EP 0 615 954 A1, EP 0 326 856 A1 and the references cited therein). Further characteristics and artificial production of colour centres are discussed in detail by John Walker in the Reports on Progress in Physics, Vol. 42 1979. The artificial production method of creating colour centres outlined in these reports comprises the steps of forming lattice defects in crystals by electron beam irradiation and, if necessary, performing annealing to cause the lattice defects to combine with nitrogen atoms contained in the crystals. However, there are limitations to the colours and uniformity that can be produced as a consequence of competitive defect formation and because of the strong growth sector dependence associated with the concentration of defects such as nitrogen in diamond.

The colour of a diamond coloured by utilising a post growth colour centre formation method is the colour of the rough diamond prior to post growth treatment combined with the effect on colour of the one or more colour centres modified or produced during post growth treatment. In order to obtain the ornamental value desired, and thus achieve a combination of high transparency and desirable colour, it has been usual practice to use diamonds that were initially either colourless or light yellow. This method is therefore not readily applicable to brown single crystal CVD diamond.

EP 671482, U.S. Pat. No. 5,672,395 and U.S. Pat. No. 5,451,430 describe methods of making polycrystalline CVD diamond more transparent using an HPHT treatment that densifies the diamond.

It is also known that the colour of brown natural diamond can be altered by annealing at high pressures and temperatures. For example, natural type IIa diamond can be made colourless by annealing at very high temperatures under stabilising pressure or it can be turned pink by annealing at rather lower temperatures, again under stabilising pressure. Brown colour in natural diamond is believed to be associated with plastic deformation but the exact cause of the brown colour and how it is modified by annealing is, however, still unknown.

There are three visual attributes to colour: hue, lightness and saturation. Hue is the attribute of colour that allows it to be classified as red, green, blue, yellow, black or white, or a hue that is intermediate between adjacent pairs or triplets of these basic hues.

White, grey and black objects are differentiated on a lightness scale of light to dark. Lightness is the attribute of colour that is defined by the degree of similarity with a neutral achromatic scale starting with white and progressing through darker levels of grey and ending with black.

Saturation is the attribute of colour that is defined by the degree of difference from an achromatic colour of the same lightness. It is also a descriptive term corresponding to the strength of a colour. The diamond trade uses adjectives such as intense, strong and vivid to denote different degrees of saturation assessed visually. In the CIE L*a*b* colour system, saturation is the degree of departure from the neutral colour axis (defined by saturation=$[(a^*)^2+(b^*)^2]^{1/2}$, see hereinafter). Lightness is a visual quality perceived separately from saturation.

Methods of depositing material such as diamond on a substrate by CVD are now well established and have been described extensively in the patent and other literature. Where diamond is being deposited on a substrate, the method generally involves providing a gas mixture which, on dissociation, can provide hydrogen or a halogen (e.g. F,Cl) in atomic form and C or carbon-containing radicals and other reactive species, e.g. $CH_x$, $CF_x$ wherein x can be 1 to 4. In addition, oxygen containing sources may be present, as may sources for nitrogen, and for boron. Nitrogen can be introduced in the synthesis plasma in many forms; typically these are $N_2$, $NH_3$, air and $N_2H_4$. In many processes inert gases such as helium, neon or argon are also present. Thus, a typical source gas mixture will contain hydrocarbons $C_xH_y$ wherein x and y can each be 1 to 10 or halocarbons $C_xH_yHal_z$ wherein x and z can each be 1 to 10 and y can be 0 to 10 and optionally one or more of the following: $CO_x$, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, RF (radio frequency) energy, a flame, a hot filament or jet based technique and the reactive gas species so produced are allowed to deposit onto a substrate and form diamond.

CVD diamond may be produced on a variety of substrates. Depending on the nature of the substrate and details of the process chemistry, polycrystalline or single crystal CVD diamond may be produced.

SUMMARY OF THE INVENTION

According to the present invention, a method of producing single crystal CVD diamond of a desired colour includes the steps of providing single crystal CVD diamond which is coloured (which sometimes in itself is desirable), and heat treating the diamond under conditions suitable to produce the desired colour.

The single crystal CVD diamond which is used as a starting material is coloured and the heat treatment is carried out under controlled conditions suitable to produce another and desirable colour in the diamond.

It is often possible to see more than one colour in a diamond. The dominant colour is that which, under standard lighting and viewing conditions, an observer would pick if forced to find the most accurate description involving only one colour. A diamond with a given dominant colour can have a colour that is modified by a range of other colours that border the dominant colour in three-dimensional colour space, such as the CIE L*a*b* colour space described hereinafter. For example, in three-dimensional colour space, the region of pink colours is bordered by white, gray, brown, orange, purple and red colour regions. Therefore a pink diamond could, in principle, show any of these colours as a modifier to different degrees and be described appropriately as, for example, grayish pink, brownish pink or orangish pink.

In this specification and in the claims, where an individual colour is referred to (e.g. brown coloured diamond, green diamond) this refers to the dominant colour, and secondary colour modifiers may be present.

In general, diamonds are polished in such a way that, when viewed in the intended way, the (face-up) colour is rather different from the inherent colour of the diamond that is best seen when the stone is viewed from the side. This is partly because the facets are polished in such a way that, for rays of light reaching the observer's eyes when the stone is viewed in the intended way, the path length within the stone is greatly increased by one or more internal reflections. The effect of increased path length on the colour coordinates can be modelled in the way described hereinafter.

The colour of the single crystal CVD diamond used as starting material is typically brown. Under suitable conditions of heat treatment, the brown colour can be converted into any one of a number of desirable colours including colourless and near colourless, and particularly fancy colours. The term "fancy" refers to a gem trade classification of more saturated and more desirable colours in diamond. More particularly, the heat treatment may be such as to produce a range of fancy green and fancy pink colours in the diamond.

The single crystal CVD diamond may be in the form of a layer or a piece of a layer, e.g. cut as a gemstone. The invention has particular application to thick diamond layers, that is diamond layers having a thickness of greater than 1 mm and to pieces produced from such layers. Further, the CVD diamond layer preferably has uniform crystal quality through its thickness so that any desirable colour is not quenched or hidden by defects related to low crystalline quality in any region of the layer. It is possible with such layers or pieces of such layers to produce a range of pink and green colours, particularly fancy pink and fancy green colours, of such a nature that they could not have been anticipated from known natural diamond heat treated by known methods, or by known HPHT synthetic material treated by known methods. In particular, layers of single crystal CVD diamond in excess of 1 mm thick provide for the production of products, for example gemstones, in which each of three orthogonal dimensions exceeds 1 mm.

It has been found that the single crystal CVD diamond heat treated or annealed under the conditions of the invention produce a range of desirable colours which can be defined in terms of the CIE L*a*b* colour space. More particularly, it has been found that the single crystal CVD diamond after heat treatment, for a 1 mm thick parallel-sided layer produced from the diamond, has a CIE Lab b* co-ordinate which lies in any one of the following ranges:

$0 \leq b^* \leq 8$
$0 \leq b^* \leq 4$
$0 \leq b^* \leq 2$
$0 \leq b^* \leq 1$

The heat treatment of the single crystal CVD diamond, as mentioned above, can lead to a diamond which is colourless or near colourless. The near colourless diamond can be defined in terms of the CIE L*a*b* colour space. More particularly, such a heat treated diamond, for a 1 mm thick parallel-sided layer produced from the diamond, may have a saturation (C*) which is less than 10 or less than 5 or less than 2.

The heat treatment will vary according to the nature of the as-grown CVD diamond and the desired colour to be produced in the CVD diamond. By way of example, it has been found that thick layers of brown single crystal CVD diamond or pieces cut from such layers can be annealed to a range of desirable pink to green colours at temperatures in the range of 1600 to 1700° C. for a period of time, typically four hours, under diamond stabilising pressure. Surprisingly, the colour of such thick diamond layers or pieces cut from such layers may also be changed to colours in the pink to green range by heat treating the layers at temperatures in the range 1400 to 1600° C. for a period of time, typically four hours, at a pressure in the graphite stable region in an inert or stabilising atmosphere. An example of an inert atmosphere is argon (Ar).

In one form of the invention, the single crystal CVD diamond is produced using a process that incorporates nitrogen to a concentration in the solid diamond of 0.05-50 ppm. The lower limit to this range is preferably 0.1 ppm, more preferably 0.2 ppm, and even more preferably 0.3 ppm. The upper limit to this range is preferably 30 ppm, more preferably 20 ppm, and even more preferably 10 ppm. This can be achieved using, for example, a plasma process in which nitrogen is present in the gas phase (initially in the form of $N_2$, $NH_3$, or some other N containing molecule). In order to achieve reproducible results and tailor the final product the N in the process needs to be controlled. Typical concentrations in the gas phase (all nitrogen gas phase concentrations in this specification are based on the $N_2$ equivalent, for example one $N_2$ molecule is equivalent to 2 $NH_3$ molecules) are 0.5 ppm-500 ppm, more preferably 1 ppm-100 ppm, and more preferably 2 ppm-30 ppm, but those skilled in the art will understand that the uptake of nitrogen is very sensitive to the process conditions such as temperature, pressure, and gas phase composition, so the invention is not confined to these limits.

Different isotopes of nitrogen may be used, for example $^{14}N$ or $^{15}N$. The effect of these different isotopes on the growth chemistry and end results is generally insignificant except in as much that any defects of which the nitrogen forms a part may have their related optical bands shifted by the difference in atomic mass. Except in example 8, $^{14}N$ has been used to derive the data presented in this specification, but the scope of the invention covers all isotopes of N.

Uptake of impurities such as nitrogen is also sensitive to the growth sector, and preferably the final layer is predominantly or essentially wholly one growth sector or type of growth sector related by symmetry. Growth sectors such as the {100}, {111}, {110}, {111} may be used, more preferably the growth sectors {100} and {113}, and most preferably the {100}. The diamond may in addition contain other dopants, such as P, S, and B in low concentration although the preferred method excludes these.

The heat treatment (anneal) is generally carried out in the temperature range of 1200° C.-2500° C. The lower bound to this range is generally set by achieving acceptable kinetic rates in the processes desired from the annealing process, in addition to selecting the equilibrium defect concentrations towards which the kinetics are progressing. The upper bound of this range is set by practical considerations, in that there is difficulty in operating HPHT processes above 2500° C., although annealing to form, in particular, near colourless diamond can be enhanced by suitable annealing above this temperature. The lower bound to this range is preferably 1250° C., more preferably 1300° C., and even more preferably 1400° C. The upper bound to this range is preferably 2000° C., more preferably 1900° C., and even more preferably 1800° C. This anneal takes place for a period of time in the range of $3-3\times10^6$ seconds. The lower bound to this range is preferably 30 seconds, more preferably 100 seconds, and even more preferably 300 seconds. The upper bound to this range is preferably $3\times10^5$ seconds, more preferably $1\times10^5$ seconds, even more preferably $2\times10^4$ seconds and even more preferably $7\times10^3$ seconds.

The anneal may take place under diamond stabilising pressure, or may take place near or below atmospheric pressure, for example in an inert or stabilising atmosphere. Those skilled in the art will appreciate that there is an interdependency between these variables, longer anneal times usually being required at lower temperatures, or when stabilising pressure is applied at the same temperature. Thus a particular range of temperatures may be more appropriate for a particular range of times, and both be different according to whether stabilising pressure is used. The upper temperature limit of annealing processes without diamond stabilising pressure is generally 1600° C., particularly where the anneal times are long or the process is not carefully controlled, because of the problem of graphitisation. However, annealing up to 1800° C., and in extreme cases 1900° C. can be achieved without diamond stabilising pressure.

For the purposes of this specification, the pressure domain can be considered to be split into two domains, the diamond stable region, often referred to as diamond stabilising pressure, and the graphite stable region. The most easily accessible region of the graphite stable region is that region around atmospheric pressure ($1.01\times10^5$ Pa), although in a controlled gas environment is it generally fairly simple to achieve lower pressures, e.g. $1\times10^2$ Pa-$1\times10^5$ Pa, and also higher pressures e.g. $1.02\times10^5$ Pa-$5\times10^5$ Pa. The range of pressures below $5\times10^5$ Pa have no discernable effect on the defect annealing within the volume of the diamond. It is further generally understood that pressures in the range of $5\times10^5$ Pa to up to diamond stabilising pressures results in no behaviour of individual defects which differs in basic nature from that obtainable from either annealing in the diamond stable region or near atmospheric pressure, although reaction rates for example may vary as some smooth function of the pressure between these two extremes, and therefore the balance and interaction between defects may vary to some degree. The annealing in the method of the invention in the graphite stable region has generally been completed at atmospheric pressure for simplicity, but this does not limit the method of the invention in covering annealing at other pressures in the graphite stable region.

Conventionally pressures used in high pressure presses are given in kilobar. For consistency, all pressures in this specification are given in Pa, with selected higher pressures converted to bar or kilobar using the conversion factor 1 bar=$1.0\times10^5$ Pa.

The coloured CVD diamond crystal of the invention preferably has a desirable hue. The hue angle for a particular hue can be found by extending the line back from the point representing that hue on the a*b* colour plot as described more fully hereinafter, and shown on FIG. 4. The hue angle of the CVD diamond after heat treatment will typically be less than 65° or less than 60° or less than 55° or less than 50°. It is well known that pink diamonds are much admired and highly prized by jewelers, collectors and consumers because of their universally acknowledged great beauty and rarity (Pink Diamonds, John M. King et al., Gems and Gemology, Summer 2002). In the diamond industry green diamonds are also highly valued and greatly admired (Collecting and Classifying Coloured Diamonds, Stephen C. Hofer, 1998, Ashland Press Inc. New York). In general, pink and green diamonds are more prized the purer the colour and the weaker the influence of secondary colour modifiers. Heat treatment or annealing conditions of the invention can increase the purity of the colour by increasing, removing, reducing or modifying absorption that contributes to colour modification. At the same time, annealing or heat treatment can increase the lightness by reducing the concentration of defects that reduce absorption over wide regions of the spectrum.

Some of the colour centres that contribute to the colour of brown CVD diamond are unique to single crystal CVD diamond or pieces cut or produced from layers of single crystal CVD diamond, and may particularly affect the perceived colour of thick layers. The fact that they are different from those contributing to the colour of natural diamond is clear because they cause absorption bands that are not found in the absorption spectra of natural diamond. It is believed that some of the colour centres relate to very localised disruption of the diamond bonding within the single crystal CVD diamond. Evidence for this comes from Raman scattering from non-diamond carbon observable with an infrared excitation source (eg 785 nm or 1064 nm). Such Raman scattering is riot observed for brown natural diamond. The relative strengths of the absorption bands in the visible region of the spectrum of brown single crystal CVD diamond can be altered by annealing, with concurrent changes in the Raman spectrum. Changes in the absorption spectrum are observed at much lower temperatures than are required to alter the colour of brown natural diamond. Significant colour changes can even be achieved by annealing at atmospheric pressure in an inert atmosphere at well below the temperature at which diamond graphitises in the absence of oxygen, for example at 1600° C. or less. This was not anticipated because conversion of non-diamond carbon to diamond usually requires treatment under high pressure and temperature conditions in a diamond-stable regime.

Characteristics associated with the CVD diamond growth mechanism can result in absorption bands centred at about 350 nm and about 510 nm and a band, centred in the near-infrared, that extends into the red region of the visible spectrum. The colour centres responsible for these bands therefore have an important influence on the colour of the as-grown CVD diamond. They are not present in natural or other synthetic diamond. Gemstones polished from as-grown CVD diamond can have desirable colours including orange brown and pinkish brown. When such diamond is heat treated or annealed under the conditions of the invention the relative strengths of the absorption bands can be altered, e.g. removed or reduced or increased, in a way that enhances the colour. A contribution to the colour change may also come from formation of colour centres via the breaking up of defects existing in the as-grown diamond or from changes in charge transfer processes that alter the dominant charge state of defects. The annealing or heat treatment step can therefore alter the combinations of colour centres to combinations that cannot be produced in as-grown CVD diamond, giving single crystal CVD diamond that has desirable colour coming from a novel combinations of colour centres. As known by persons skilled in the art, broad bands such as the 350 nm and 510 nm may exhibit small variations in the position of maximum intensity, but this does not change their identity.

DESCRIPTION OF EMBODIMENTS

The invention achieves the controlled conversion of a coloured single crystal CVD diamond to another colour under suitable and controlled heat treatment conditions. The single crystal CVD diamond is preferably in the form of a thick layer or a piece cut or produced from such a layer. The thick layer of single crystal CVD diamond should be of high quality and is preferably made by providing a diamond substrate having a surface which is substantially free of crystal defects, providing a source gas, dissociating the source gas and allowing homo-epitaxial diamond growth on the surface which is substantially free of crystal defects. CVD diamond grown in such a manner is free of the inclusions which typify HPHT diamond, particularly HPHT diamond where the colour is not dominated by single substitutional nitrogen.

Generally, the method is carried out in the presence of nitrogen which is added to the synthesis plasma. The presence of nitrogen produces brown colour centres in the diamond. When added in a controlled way, nitrogen disrupts the growth of the diamond sufficient y to cause the incorporation of colour centres involving carbon bonded in non-diamond ways, while giving diamond that is of good single crystal quality as judged using x-ray techniques such as X-ray topography.

It is important for the production of high crystalline quality thick single crystal CVD diamond that growth takes place on a diamond surface which is substantially free of crystal defects. In this context, defects primarily mean dislocations and micro cracks, but also include twin boundaries, point defects not intrinsically associated with the dopant N atoms, low angle boundaries and any other extended disruption to the crystal lattice. Preferably the substrate is a low birefringence type Ia natural, Ib or IIa high pressure/high temperature synthetic diamond or a CVD synthesised single crystal diamond.

The quality of growth on a substrate which is not sufficiently free of defects rapidly degrades as the layer grows thicker and as the defect structures multiply, causing general crystal degradation, twinning and renucleation.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as $50/mm^2$ with more typical values being $10^2/mm^2$, whilst in others it can be $10^6/mm^2$ or greater.
2) Those resulting from polishing, including dislocation structures and microcracks forming chatter tracks along polishing lines. The density of these can vary considerably over a sample, with typical values ranging from about $10^2/mm^2$, up to more than $10^4/mm^2$ in poorly polished regions or samples.

The preferred low density of defects is such that the density of surface etch features related to defects, as described above, are below $5 \times 10^3/mm^2$, and more preferably below $10^2/mm^2$.

The defect level at and below the substrate surface on which the CVD growth takes place may thus be minimised by careful preparation of the substrate. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete. Particular processing steps may include conventional diamond processes such as mechanical sawing, lapping and polishing (in this application specifically optimised for low defect levels), and less conventional techniques such as laser processing or ion implantation and lift off techniques, chemical/mechanical polishing, and both liquid and plasma chemical processing techniques. In addition, the surface $R_Q$ (root mean square deviation of surface profile from flat measured by stylus profilometer, preferably measured over 0.08 mm length) should be minimised, typical values prior to any plasma etch being no more than a few nanometers, i.e. less than 10 nanometers.

One specific method of minimising the surface damage of the substrate, is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of $50\text{-}450 \times 10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma into the gas phase or to the substrate surface. The hydrogen etch following the oxygen etch is less specific to crystal defects rounding off the angularities caused by the oxygen etch which aggressively attacks such defects and providing a smoother, better surface for subsequent growth.

The surface or surfaces of the diamond substrate on which the CVD diamond growth occurs are preferably the {100}, {110}, {113} or {111} surfaces. Due to processing constraints, the actual sample surface orientation can differ from these ideal orientations up to 50, and in some cases up to 100, although this is less desirable as it adversely affects reproducibility.

It is also important in the method of the invention that the impurity content of the environment in which the CVD growth takes place is properly controlled. More particularly, the diamond growth must take place in the presence of an atmosphere containing substantially no contaminants other than the intentionally added nitrogen or other dopants. The nitrogen concentration should be controlled to better than 500 parts per billion (as a molecular fraction of the total gas volume) or 5% of the target concentration in the gas phase, whichever is the larger, and preferably to better than 300 parts per billion (as a molecular fraction of the total gas volume) or 3% of the target concentration in the gas phase, whichever is the larger, and more preferably to better than 100 parts per billion (as a molecular fraction of the total gas volume) or 1% of the target concentration in the gas phase, whichever is the larger. Measurement of absolute and relative nitrogen concentration in the gas phase at concentrations as low as 100 ppb requires sophisticated monitoring equipment such as that which can be achieved, for example, by gas chromatography. An example of such a method is now described:

Standard gas chromatography (GC) art consists of: a gas sample stream is extracted from the point of interest using a narrow bore sample line, optimised for maximum flow velocity and minimum dead volume, and passed through the GC sample coil before being passed to waste. The GC sample coil is a section of tube coiled up with a fixed and known volume (typically 1 cm$^3$ for standard atmospheric pressure injection) which can be switched from its location in the sample line into the carrier gas (high purity He) line feeding into the gas chromatography columns. This places a sample of gas of known volume into the gas flow entering the column; in the art, this procedure is called sample injection.

The injected sample is carried by the carrier gas through the first GC column (filled with a molecular sieve optimised for separation of simple inorganic gases) and is partially separated, but the high concentration of primary gases (e.g. $H_2$, Ar) causes column saturation which makes complete separation of, for example nitrogen difficult. The relevant section of the effluent from the first column is then switched into the feed of a second column, thereby avoiding the majority of the other gases being passed into the second column, avoiding column saturation and enabling complete separation of the target gas ($N_2$). This procedure is called "heart-cutting".

The output flow of the second column is put through a discharge ionisation detector (DID), which detects the increase in leakage current through the carrier gas caused by the presence of the sample. Chemical structure is identified by the gas residence time which is calibrated from standard gas mixtures. The response of the DID is linear over more than 5 orders of magnitude, and is calibrated by use of special calibrated gas mixtures containing the species to be detected, typically in the range of 10-100 ppm, made by gravimetric analysis and then verified by the supplier. Linearity of the DID can be verified by careful dilution experiments. Target N containing species include the type of gas used as a deliberate dopant (e.g. $N_2$, $NH_3$) and also $N_2$ which may result from atmospheric contamination, and any other n containing species which may be relevant to the conditions of measurement.

This known art of gas chromatography has been further modified and developed for this application as follows: The processes being analysed here are typically operating at 50–500×10$^2$ Pa. Normal GC operation uses the excess pressure over atmospheric pressure of the source gas to drive the gas through the sample line. Here, the sample is driven by attaching a vacuum pump at the waste end of the line and the sample drawn through at below atmospheric pressure. However, whilst the gas is flowing the line impedance can cause significant pressure drop in the line, affecting calibration and sensitivity. Consequently, between the sample coil and the vacuum pump is placed a valve which is shut for a short duration before sample injection in order to enable the pressure at the sample coil to stabilise and be measured by a pressure gauge. To ensure a sufficient mass of sample gas is injected, the sample coil volume is enlarged to about 5 cm$^3$. Dependent on the design of the sample line, this technique can operate effectively down to pressures of about 70×10$^2$ Pa. Calibration of the GC is dependent on the mass of sample injected, and the greatest accuracy is obtained by calibrating the GC using the same sample pressure as that available from the source under analysis. Very high standards of vacuum and gas handling practice must be observed to ensure that the measurements are correct.

The point of sampling may be upstream of the synthesis chamber to characterise the incoming gases, within the chamber to characterise the chamber environment, or downstream of the chamber.

The source gas may be any known in the art and will contain a carbon-containing material which dissociates producing radicals or other reactive species. The gas mixture will also generally contain gases suitable to provide hydrogen or a halogen in atomic form.

The dissociation of the source gas is preferably carried out using microwave energy in a reactor examples of which are known in the art. However, the transfer of any impurities from the reactor should be minimised. A microwave system may be used to ensure that the plasma is placed away from all surfaces except the substrate surface on which diamond growth is to occur and its mount. Examples of a preferred mount materials are: molybdenum, tungsten, silicon and silicon carbide.

Examples of preferred reactor chamber materials are stainless steel, aluminium, copper, gold and platinum.

A high plasma power density should be used, resulting from high microwave power (typically 3-60 kW, for substrate diameters of 25-300 mm) and high gas pressures (50-500×10$^2$ Pa, and preferably 100-450×10$^2$ Pa).

Using the above conditions it has been possible to produce thick high quality single crystal CVD diamond layers with a brown colour using nitrogen additions to the gas flow in the ranges 0.1 to 500 ppm.

The thick high quality single crystal CVD diamond or a piece thereof is then subjected to heat treatment. The piece may, for example, take the form of a gemstone.

Embodiments of the invention will now be described. Table 1 below lists seven different combinations (referred to as Case 1-7) of absorption bands that can be found in as-grown brown single crystal CVD diamond. The breakdown of the spectrum of brown CVD diamond into these absorption bands is discussed in detail in WO 03/052177A1.

The feature at 270 nm is present in each case and it relates to isolated nitrogen impurities at substitutional sites within the diamond lattice. It is well known that the associated absorption spreads into the visible region of the absorption spectrum and gives the distinctive yellow hue of type Ib diamond.

Case 1: The ramp feature denotes a general rise in absorption from the red to ultra-violet. This is observed in the spectrum of many single crystal CVD diamond layers and is undesirable in that by itself, or in combination with isolated substitutional nitrogen, it gives a dull brown hue.

Case 2: Broad bands at approximately 350 nm and 510 are believed to be associated with localised disruption of the CVD diamond structure that gives states within the band gap. In as-grown samples of single crystal CVD diamond, these features tend to appear together. In association with isolated substitutional nitrogen, they can give hues ranging from orange brown to pink brown, depending on the relative strengths of the three contributions.

Case 3: Brown single crystal CVD diamond may also show a broad band centred in the NIR region of the spectrum and, when reasonably strong, the short wavelength side of this band can give rise to significant absorption at the red end of the visible spectrum. By itself this would cause a blue hue. When seen together with isolated substitutional nitrogen the resulting absorption at both ends of the spectrum gives the diamond a green hue.

Case 4: The spectrum of many brown single crystal CVD diamond layers can be reconstructed as the sum of isolated substitutional nitrogen, ramp and 350/510 nm band contributions. This combination tends to give an orange brown hue.

Cases 5, 6 and 7 cover three other combinations of the absorption features discussed above. These combinations can give a range of different brown hues depending on the relative strengths of the component absorption features.

TABLE 1

|  | 270 nm | Ramp | 350 nm | 510 nm | NIR band | Resultant colour |
| --- | --- | --- | --- | --- | --- | --- |
| Case 1 | Yes | Yes | No | No | No | Dull brown |
| Case 2 | Yes | No | Yes | Yes | No | Pinkish brown |
| Case 3 | Yes | No | No | No | Yes | Green |
| Case 4 | Yes | Yes | Yes | Yes | No | Orange Brown |
| Case 5 | Yes | Yes | No | No | Yes | Brown |
| Case 6 | Yes | No | Yes | Yes | Yes | Brown |
| Case 7 | Yes | Yes | Yes | Yes | Yes | Brown |

Brown single crystal CVD diamond was annealed under various conditions and the effect thereof was observed.

It was found that the ramp and the 350 nm band can be substantially removed by treatment at 1400-1600° C. for four hours at atmospheric pressure in an inert atmosphere. A similar effect can also be achieved by annealing at 1600-1700° C. for four hours under diamond-stabilising pressure. By itself these treatments can have a significant effect on the colour of the diamond in, for example, cases 1, 2, 4, 5, 6 and 7 as shown in table 2.

TABLE 2

|  | Initial colour | Final colour |
| --- | --- | --- |
| Case 1 | Dull brown | Lighter brown/near colourless |
| Case 2 | Pinkish brown | Pink brown to brownish pink |
| Case 4 | Orange brown | Pink brown to brownish pink |
| Case 5 | Brown | Green |
| Case 6 | Brown | Lighter brown |
| Case 7 | Brown | Lighter brown |

In this temperature range it is also possible for absorption relating to the negatively charged nitrogen-vacancy centre (with a zero-phonon line at 637 nm) to be significantly increased. The increase in the associated absorption (peaking at approximately 550 nm) tends to make samples look pinker in colour. This increased absorption may be caused by a change in charge transfer that causes more of the nitrogen-vacancy centres to be in the negative charge state. It may be caused by the formation of additional nitrogen-vacancy centres as a result of capture of released vacancies at isolated nitrogen or dissociation of more complex defects. There may also be an increase in the luminescence excited from negative nitrogen vacancy centres and in extreme cases this could affect the apparent colour of the diamond.

Thus, by choosing suitable conditions of heat treatment, it is possible to produce coloured single crystal CVD diamond having a fancy colour ranging from pink to green.

It was found that annealing for four hours al: 1800° C. under diamond stable pressure conditions causes a slight decrease in both the 510 nm band and the NIR band, giving the colour changes shown in table 3 in the cases considered.

TABLE 3

|  | Initial colour | Final colour |
| --- | --- | --- |
| Case 1 | Dull brown | Near colourless |
| Case 2 | Pinkish brown | Pink brown to brownish pink |
| Case 3 | Green | Less intense green |
| Case 4 | Orange brown | Pinkish |
| Case 5 | Brown | Greenish |
| Case 6 | Brown | Lighter brown |
| Case 7 | Brown | Lighter brown |

It was found that annealing for four hours at 1900° C. or at higher temperatures under diamond stabilising pressure removes both the 510 nm band and the NIR band, giving the colour changes shown in table 4 in the cases considered.

TABLE 4

|  | Initial colour | Final colour |
| --- | --- | --- |
| Case 1 | Dull brown | Near colourless |
| Case 2 | Pinkish brown | Near colourless |
| Case 3 | Green | Near colourless |
| Case 4 | Orange brown | Near colourless |
| Case 5 | Brown | Near colourless |
| Case 6 | Brown | Near colourless |
| Case 7 | Brown | Near colourless |

Under these annealing conditions the nitrogen-vacancy centre can be dissociated into an isolated substitutional nitrogen and a vacancy that migrates away. Nitrogen vacancy centres, are therefore less likely to influence the colour of (formerly brown) diamond after annealing treatments at this or higher temperatures. After such Treatments such diamond does however show strong green luminescence that may give it a greenish hue under some viewing and lighting conditions.

When excited with 325 nm HeCd laser light, the photoluminescence spectra of brown CVD diamond that has been annealed at temperatures high enough to substantially dissociate the nitrogen-vacancy defects formed during the growth process, tends to be dominated by bands in the spectral region between 450 and 550 nm. H3 luminescence (with a zero-phonon line at 503 nm) may be observed and, after anneals at the highest temperatures, N3 luminescence (with a zero-phonon line at 415 nm) may also be detected. With above bandgap UV or electron beam excitation, there is a tendency for the dominant visible luminescence to change from green to blue as the annealing time is increased for the highest temperature anneals.

There are other photoluminescence lines in the spectrum of (formerly brown) single crystal CVD diamond that has been annealed. For example, a photoluminescence line at approximately 851 nm is readily excited with a 785 nm laser. Although not shown by as-grown brown CVD diamond, this line has been detected for brown CVD diamond annealed at temperatures as low as 1200° C. This photoluminescence line has never been seen in any other kind of diamond and therefore appears to be unique to brown CVD diamond that has been annealed under conditions that could change its colour.

Using Nd:YAG laser excitation (1064 nm) other photoluminescence lines may be observed at 1263 nm, 1274 nm and 1281 nm. These have also only been observed for single crystal brown CVD diamond that has been annealed under conditions that could change its colour.

As-grown brown single crystal CVD diamond that can have its colour significantly improved by annealing treatments may show infrared absorption bands relating to the stretch modes of carbon-hydrogen bonds in the 2800-3000 $cm^{-1}$ region of the spectrum. These bands are generally altered but not completely removed by high temperature annealing treatments and are not generally seen in the absorption spectra of natural or HPHT synthetic diamond. Some natural diamond shows a hydrogen-related absorption line at 3107 $cm^{-1}$ that has never been seen in the spectra of untreated CVD diamond. Annealing of brown single crystal CVD diamond at temperatures greater than approximately 1800° C. can cause the formation of the H-related defect responsible for the line at 3107 $cm^{-1}$. This defect is extremely stable and is observed in the spectra of samples annealed at extremely high temperatures. Thus the observation of the 3107 $cm^{-1}$ line in material known to be CVD is indicative that the material has been annealed according to the method of this invention. Further, the observation of the 3107 $cm^{-1}$ absorption line in combination with the CH-stretch features is particularly indicative that the diamond is CVD diamond that has been given a post-growth high temperature annealing treatment of a kind that has changed its colour in the way described herein.

Optical characteristics such as those described above have benefit in providing evidence of the prior history of a sample of diamond, in addition to any modification in colour that they may generate. Determination of the presence or absence of the optical features presented in this specification is understood by those skilled in the art.

For polycrystalline CVD diamond, voids may give rise to reduced optical transmission towards shorter wavelengths. The single crystal CVD diamond of the present invention does not contain voids, either before or after annealing. Samples of such diamond were studied closely, both in cross-section and plan view, with a high magnification (×1000) optical microscope. Nothing that could have been a void was observed. Optical microscopy therefore sets an upper limit on the dimensions of voids of the order of 200 nm.

Transmission electron microscopy (TEM) allows thin slices of diamond to be viewed with sub-nanometer resolution. Several TEM slices of unannealed brown CVD diamond have been imaged using TEM in order to investigate the possibility that the colour is caused by the presence of extended defects. In order to generate the uniform colour, such defects would need to be well distributed through the diamond and of significant density, and thus detectable by using TEM. As such this distribution is quite distinct from the distribution of dislocations or dislocation bundles observed by techniques such as X-ray topography, where dislocations thread in the direction of growth and originate from either substrate defects or from particles or other surface defects on the substrate used for the CVD growth. Imaging of several hundred square microns of unannealed brown CVD diamond has not revealed anything that could correspond to a void. Only in specimens of extremely dark brown diamond were any extended defects in the form of dislocations and stacking fault defects seen at all. In the case of weak and moderately brown samples such extended defects were not observed at all in the area investigated by TEM.

The chromaticity co-ordinates can be used as a measure or means of illustrating the difference between the fancy colours of single crystal CVD diamond produced by the method of the invention compared with those occurring in the other types or forms of diamond.

It is the perceived colour that is important in the annealed or heat treated single crystal CVD diamond of this invention and because chromaticity coordinates relate more directly to perceived colour than a transmittance spectrum does, the use of chromaticity coordinates assists in showing the novel features of such diamond. Differences in the absorption spectrum of the CVD diamond of this invention give rise to perceived colours that can be different from those previously demonstrated for other CVD diamond or HPHT synthetic diamond.

It may be true that beauty is in the eye of the beholder and that hue may be a matter of personal preference. On the other hand, it is acknowledged by the diamond industry that pink and green diamonds are more highly prized than brown diamond and become even more prized as the influence of colour modifiers is reduced. Pink or green diamond is more likely to yield a desirable colour in a skillfully polished stone if it has a high lightness for a given saturation. A polished diamond with the same hue and saturation is less likely to give a pleasing colour if it has low lightness.

Furthermore, there are applications in optics and electromagnetic transmission where for example a window is required to have certain absorption characteristics. This may simply be a low overall absorption, or low absorption in certain bands, or it may include the need for specific absorption peaks such as for applications measuring radiation by calorimetric means. Thus the diamond of the invention has particular use in optical applications. Optical applications may not be restricted to the visible region, but may extend into the UV and into the IR and beyond. In particular it is anticipated that this material will also have application in the microwave region.

CIE L*a*b* Chromaticity Coordinate Derivation

The perceived colour of an object depends on the transmittance/absorbance spectrum of the object, the spectral power distribution of the illumination source and the response curves of the observer's eyes. The CIELAB chromaticity coordinates quoted in this patent application have been derived in the way described below. Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum using the relationships below, between 350 nm and 800 nm with a data interval of 1 nm:

$S_\lambda$=transmittance at wavelength λ
$L_\lambda$=spectral power distribution of the illumination
$x_\lambda$=red response function of the eye
$y_\lambda$=green response function of the eye
$z_\lambda$=blue response function of the eye $X = \Sigma_\lambda [S_\lambda x_\lambda L_\lambda]/Y_0$ $Y = \Sigma_\lambda [S_\lambda y_\lambda L_\lambda]/Y_0$ $Z = \Sigma_\lambda [S_\lambda z_\lambda L_\lambda]/Y_0$ Where $Y_0 = \Sigma_\lambda y_\lambda L_\lambda$ $L^* = 116(Y/Y_0)^{1/3} - 16 =$ Lightness (for $Y/Y_0 > 0.008856$)

$a^* = 500[(X/X_0)^{1/3} - (Y/Y_0)^{1/3}]$ (for $X/X_0 > 0.008856$, $Y/Y_0 > 0.008856$)

$b^* = 200[(Y/Y_0)^{1/3} - (Z/Z_0)^{1/3}]$ (for $Z/Z_0 > 0.008856$)

$C^* = (a^{*2} + b^{*2})^{1/2} =$ saturation $h_{ab} = \arctan(b^*/a^*) =$ hue angle Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is normal to plot a* and b* coordinates on a graph with a* corresponding to the x axis and b* corresponding to the y axis. Positive a* and b* values correspond respectively to red and yellow components to the hue. Negative a* and b* values correspond respectively to green and blue components. The positive quadrant of the graph then covers hues ranging from yellow through orange to red, with saturations (C*) given by the distance from the origin.

It is possible to predict how the a*b* coordinates of diamond with a given absorption coefficient spectrum will change as the optical path length is varied. In order to do this, the reflection lose must first be subtracted from the measured absorbance spectrum. The absorbance is then scaled to allow for a different path length and then the reflection loss is added back on. The absorbance spectrum can then be converted to a transmittance spectrum which is used to derive the CIELAB coordinates for the new thickness. In this way the dependence of the hue, saturation and lightness on optical path length can be modelled to give an understanding of how the colour of diamond with given absorption properties per unit thickness will depend on the optical path length.

L*, the lightness, forms the third dimension of the CIELAB colour space. It is important to understand the way in which the lightness and saturation vary as the optical path length is changed for diamond with particular optical absorption properties. This can be illustrated on a colour tone diagram in which L* is plotted along the y-axis and C* is plotted along the x-axis (such as FIG. 4). The method described in the preceding paragraph can also be used to predict how the L*C* coordinates of diamond with a given absorption coefficient spectrum depend on the optical path length.

A broad scale of lightness can be defined in the following way: Light: 95>L*>65, Medium: 65>L*>35, Dark: 35>L*>05.

The C* (saturation) numbers can be divided into saturation ranges of 10 C* units and assigned descriptive terms as below.

|  |  |
|---|---|
| 0-10 | weak |
| 10-20 | weak-moderate |
| 20-30 | moderate |
| 30-40 | moderate-strong |
| 40-50 | strong |
| 50-60 | strong-very strong |
| 60-70 | very strong |
| 70-80+ | very very strong |

Example 1

A 3.2 mm thick CVD layer was grown on an HPHT synthetic diamond substrate. The surface of the substrate on which growth was to take place was prepared according to the method described in WO 01/96634.

This substrate was mounted on a tungsten substrate using a high temperature braze suitable for diamond. This was introduced into a microwave reactor, an etch and growth cycle used to prepare the substrate surface, and then growth commenced. More particularly:

1) The reactor was pre-fitted with point of use purifiers, reducing nitrogen levels in the incoming gas stream (excluding the $N_2$ dopant line) to below 80 ppb, as determined by the modified GC method described above.
2) An in situ oxygen plasma etch was performed using 30/150/1200 sccm (standard cubic centimeter per second) of $O_2/Ar/H_2$ at $235 \times 10^2$ Pa and a substrate temperature of 840° C.
3) This moved without interruption into a hydrogen etch at 850° C. with the removal of the $O_2$ from the gas flow.
4) This moved into the growth process by the addition of the carbon source which in this instance was $CH_4$ at 32 sccm. The growth temperature at this stage was 890° C.
5) Nitrogen ($N_2$) was introduced into the growth process at a concentration of 10 ppm.
6) On completion of the growth period, the substrate was removed from the reactor and the CVD layer was released from the substrate.

The single substitutional nitrogen concentration in this layer was estimated to be approximately 0.40 ppm from the 270 nm absorption feature in the absorption spectrum. The absorption spectrum also contained broad bands centred at approximately 360 nm and 520 nm and a general rise (ramp) in absorption coefficient from the red to the ultra-violet.

The layer was polished into a round brilliant cut stone of 0.55 carats and was graded as fancy light brown, VS1. It was then annealed at 1700° C. for four hours under diamond stabilising pressure of approximately $6.5 \times 10^9$ Pa (65 kbar). Without any further processing, it was then graded as fancy light pink brown, VS1.

The culet of the round brilliant was enlarged to allow a quantitative absorption spectrum to be recorded. This indicated no significant change in the concentration of single substitutional nitrogen. The strength of the band at 360 nm and the ramp in the absorption spectrum had been substantially reduced but the band at approximately 520 nm remained largely unchanged. An absorption spectrum recorded at 77 K showed a weak line at 637 nm (with the associated vibronic bands) from negative nitrogen-vacancy centres. The photoluminescence spectrum was dominated by luminescence from the nitrogen-vacancy detects with zero-phonon lines at 575 nm and 637 nm. Raman normalised photoluminescence spectra recorded at 77 K with 514 nm excitation before and after annealing indicated that the annealing treatment had caused an increase in photoluminescence from nitrogen-vacancy centres and this coupled with an increase in the associated absorption may have contributed to the change in perceived colour.

Example 2

A 3.1 mm thick CVD layer was grown or an HPHT synthetic diamond substrate using a process similar to that set out in Example 1. The single substitutional nitrogen concentration in this sample was estimated to be approximately 0.5 ppm from the strength of the 270 nm feature in the absorption spectrum.

The layer was polished into a round brilliant of 0.49 carats that was graded as light brown, VS1. It was then annealed at 2100° C. for twenty-four hours under diamond stabilising pressure of approximately $7.5 \times 10^9$ Pa (75 kbar). After repolishing to 0.44 carats, it was then graded as fancy light greyish green, VS1.

The culet of the round brilliant was then enlarged to allow an absorption spectrum to be recorded. By itself, the absorption spectrum was insufficient to explain the green hue of the stone. Photoluminescence spectra (with a HeCd laser or Xe lamp excitation) showed strong green luminescence from defects (H3 and other unidentified defects) that were formed by the annealing process. In this case the perceived green hue is predominantly a result of the green photoluminescence and its dependence on viewing conditions is consistent with this deduction. Raman normalised photoluminescence spectra recorded at 77 K with 514 nm excitation before and after annealing indicated that the annealing treatment had caused a decrease in photoluminescence from nitrogen-vacancy centres and this coupled with a decrease in the associated absorption may have contributed to the change in perceived colour.

Example 3

A 3.10 mm thick CVD layer was grown on an HPHT synthetic diamond substrate in a process similar to that set out in Example 1. The single substitutional nitrogen concentration in this sample was estimated to be approximately 0.5 ppm from the strength of the 270 nm feature in the absorption spectrum. The absorption spectrum also contained broad bands centred at approximately 360 nm and 515 nm and a general rise (ramp) in absorption coefficient from the red to the ultra-violet.

The layer was polished into a round brilliant of 0.51 carats that was graded as light brown, 13. It was then annealed at 1700° C. for twenty-four hours under diamond stabilising pressure of approximately $6.5 \times 10^9$ Pa (65 kbar). Without any further processing it was graded as light orangish pink, 13.

The culet of the round brilliant was then enlarged to allow an absorption spectrum to be recorded. This indicated no significant change in concentration of single substitutional nitrogen. The strength of the band at 360 nm and the ramp in the absorption spectrum (from red to ultra-violet) had been substantially reduced but the band at approximately 515 nm remained largely unchanged. The photoluminescence spectrum was dominated by photoluminescence from the N-V defects with zero-phonon lines at 575 nm and 637 nm. Raman normalised photoluminescence spectra recorded at 77 K with 514 nm excitation before and after annealing indicated that the strength of the N-V luminescence had not been greatly affected by the annealing treatment. The change in perceived colour was predominantly a result of the change in the absorption spectrum.

Example 4

Single crystal CVD diamond was grown to a thickness of 2 mm on a {100} diamond substrate in a process similar to that set out in Example 1. The gas mixture included 2.5 ppm of nitrogen. The substrate was removed and a polished CVD sample Ex-4 measuring 4.5 mm×4.0 mm×2 mm was produced.

Figure 1:
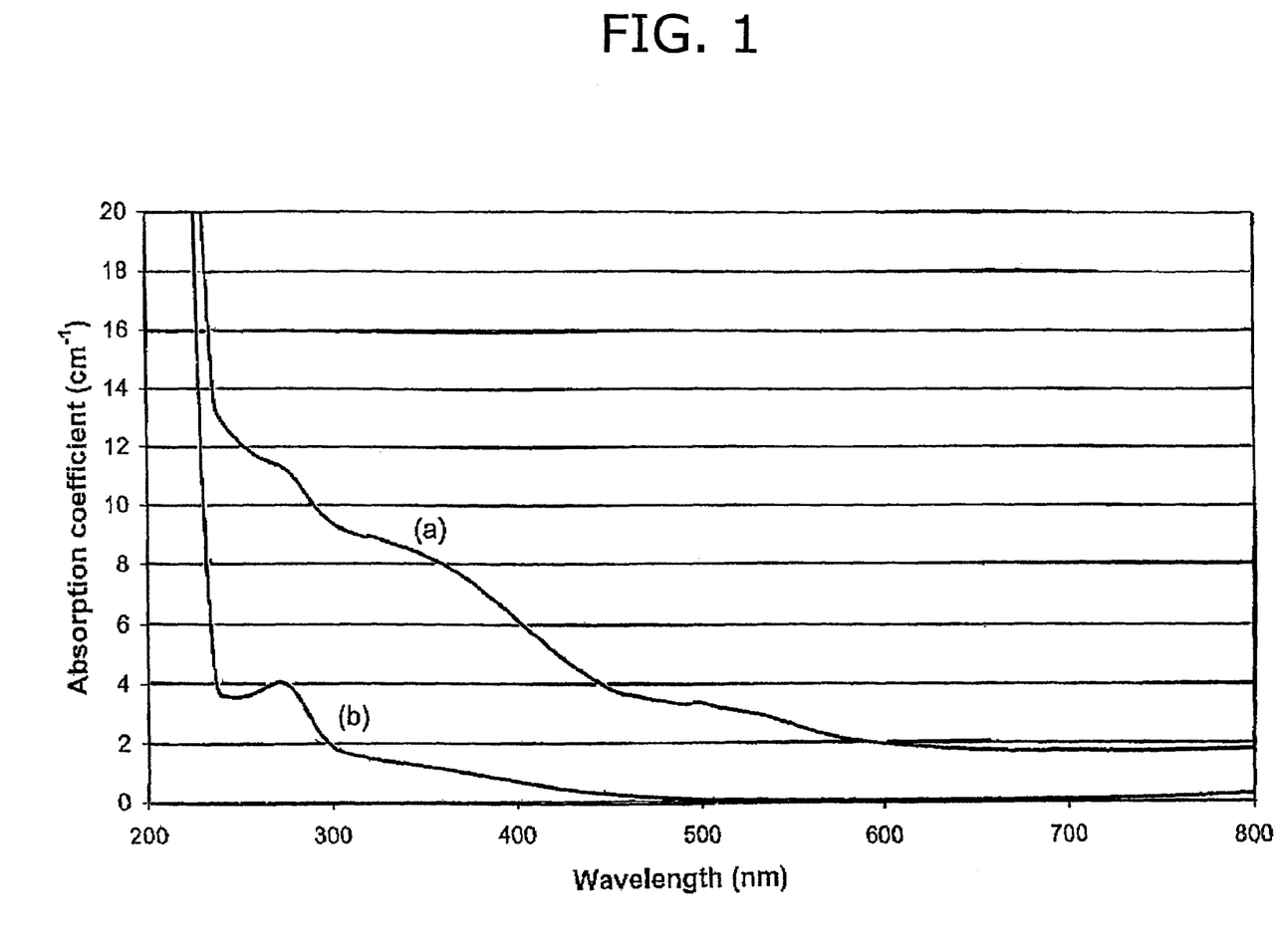
FIG. 1 The UV-visible absorption spectra of sample Ex-4 recorded (a) before and (b) after annealing at 2400° C. for 4 hours at a pressure of approximately $8.0 \times 10^9$ Pa (80 kbar)

This sample had a brown colour. Its UV/visible absorption spectrum is labelled (a) in FIG. 1. In addition to absorption features associated with single substitutional nitrogen, the spectrum contains broad bands at approximately 515 nm and 365 nm. There is also a general increase in absorption coefficient towards shorter wavelengths.

The CVD diamond sample was then annealed at 2400° C. for 4 hours under diamond stabilising pressure of approximately $8.0 \times 10^9$ Pa (80 kbar). After this treatment, it was near-colourless. Its UV/visible absorption spectrum is labelled (b) in FIG. 1. The remaining absorption fits the shape of a type Ib spectrum containing approximately 1.1 ppm of nitrogen in single substitutional sites. The annealing treatment removed the additional absorption shown by the as-grown sample.

From the absorbance spectra of this sample measured before and after annealing the CIELAB coordinates of the diamond were derived in the way discussed earlier. They are tabulated below. The annealing process greatly reduced the b* coordinate and the saturation, while increasing the lightness.

|  | Before annealing | After annealing |
|---|---|---|
| a* | 2.8 | −0.9 |
| b* | 12.0 | 1.9 |
| C* | 12.3 | 2.1 |
| L* | 72 | 86 |

Example 5

Single crystal CVD diamond was grown to a thickness of 3 mm on a {100} diamond substrate in a process similar to that set out in Example 1. The pressure was $250 \times 10^2$ Pa, the substrate temperature 815° C., and the gas mixture contained 7.5 ppm of nitrogen. The substrate was removed and a polished cross-sectional CVD diamond slice Ex-5 measuring 3 mm×2 mm×0.86 mm was produced.

Figure 2:
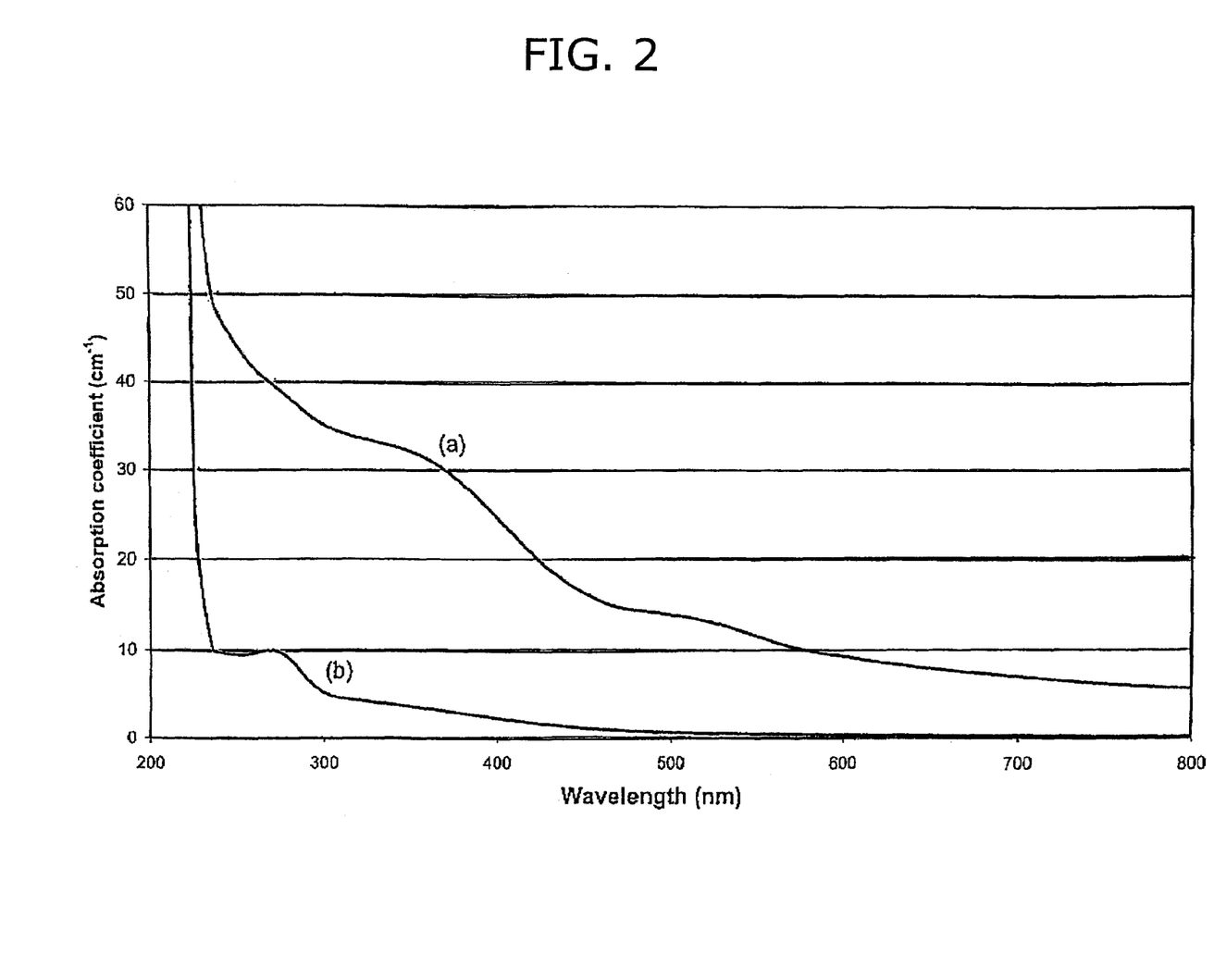
FIG. 2 The UV-visible absorption spectra of sample Ex-5 recorded (a) before and (b) after annealing at 1900° C. for 4 hours at a pressure of approximately $7.0 \times 10^9$ Pa (70 kbar)

This sample had an orangish brown colour. Its UV/visible absorption spectrum is labelled (a) in FIG. 2. In addition to absorption features associated with single substitutional nitrogen, it contains broad bands at approximately 515 nm and 365 nm. There is also a general increase in absorption coefficient towards shorter wavelengths.

The sample was then annealed at 1900° C., for 4 hours under diamond stabilising pressure of approximately $7.0 \times 10^9$ Pa (70 kbar). After this treatment, it was near-colourless. Its UV/visible absorption spectrum is labelled (b) in FIG. 2. The remaining absorption fits reasonably well to the shape of a type Ib spectrum containing approximately 2.2 ppm of nitrogen in single substitutional sites. The annealing treatment therefore removed the additional absorption shown by the as-grown sample and made it near-colourless.

From the absorbance spectra of this sample measured before and after annealing the CIELAB coordinates of the diamond were derived in the way discussed earlier. They are tabulated below. The annealing process greatly reduced the b* coordinate and the saturation, while increasing the lightness.

|  | Before annealing | After annealing |
|---|---|---|
| a* | 4.6 | −0.5 |
| b* | 16.8 | 3.0 |
| C* | 17.4 | 3.0 |
| L* | 58.9 | 87 |

Example 6

Figure 3:
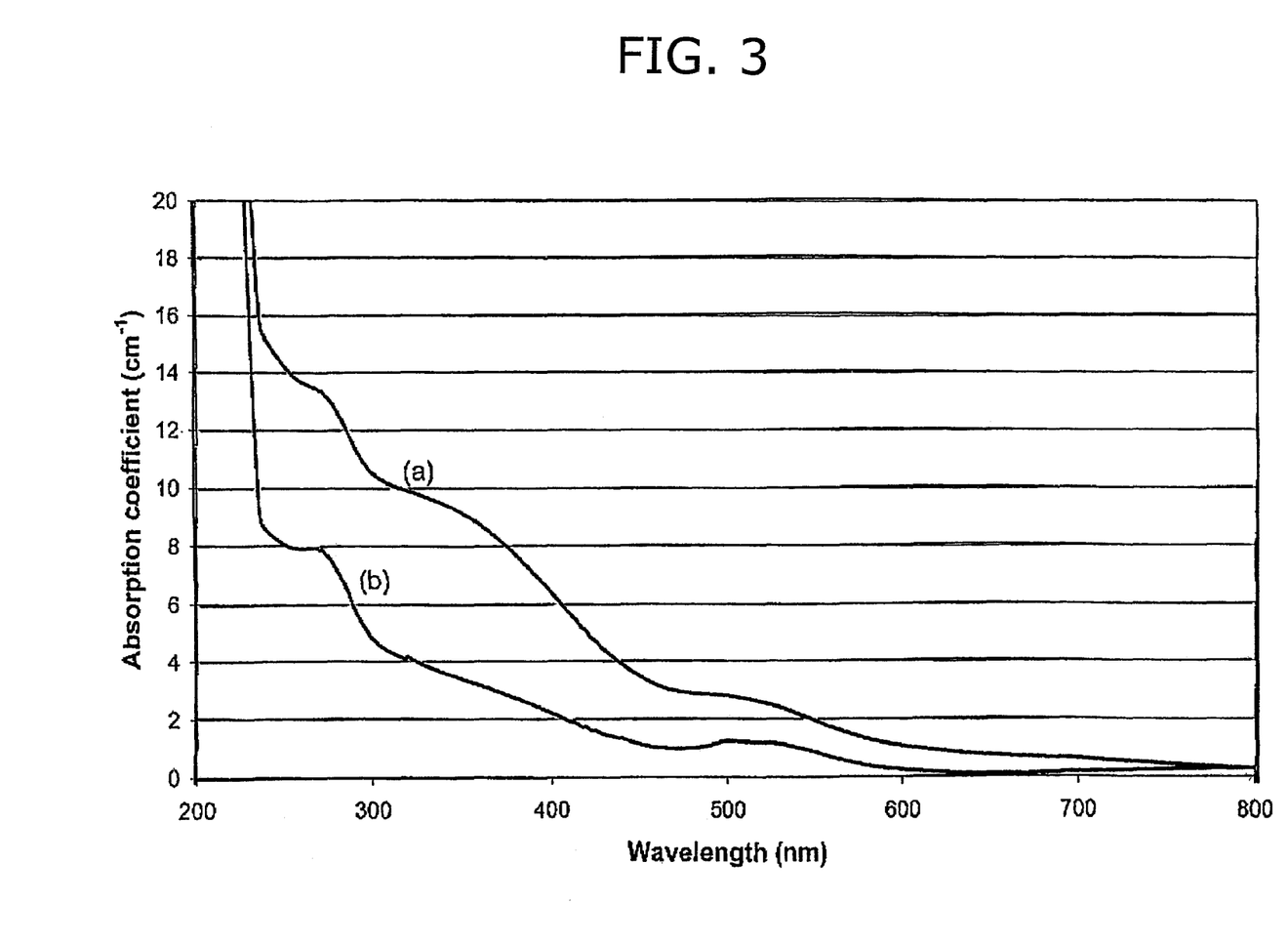
FIG. 3 The UV-visible absorption spectra of sample Ex-6 recorded (a) before and (b) after annealing at 1600° C. for 4 hours at a pressure of approximately $6.5 \times 10^9$ Pa (65 kbar)

Single crystal CVD diamond was grown to a thickness of 1.8 mm on a {100} diamond substrate in a process similar to that set out in Example 1. The pressure was $257 \times 10^2$ Pa, the substrate temperature 812° C., and the gas mixture contained 3.8 ppm of nitrogen. The substrate was removed and the UV/visible absorption spectrum (labelled (a) in FIG. 3) of the resulting brown diamond plate Ex-6 was measured.

The sample was then annealed at 1600° C. under diamond stabilising pressure of approximately $6.5 \times 10^9$ Pa (65 kbar) for 4 hours. After this treatment, the dominant component of its colour was pink. The UV/visible absorption spectrum of the annealed sample Ex-6 is labelled (b) in FIG. 3. This spectrum is made up of absorption relating to single substitutional nitrogen with a concentration of approximately 1.2 ppm, a band centred at approximately 515 nm, and some residual absorption in the ultraviolet. The annealing treatment has removed the band centred at approximately 365 nm and has significantly reduced the general rise in absorption towards shorter wavelengths.

Raman/photoluminescence spectra with 785 nm laser excitation were recorded at room temperature, before and after the annealing treatment, using a Renishaw Ramanascope with a CCD detector and fitted with a Olympus BH-2 microscope (×10 objective). It was found that the annealing treatment had introduced a series of photoluminescence lines in the near-infra-red region of the spectrum. These included a line at approximately 851 nm and two broader lines at approximately 816 and 825 nm.

Figure 4:
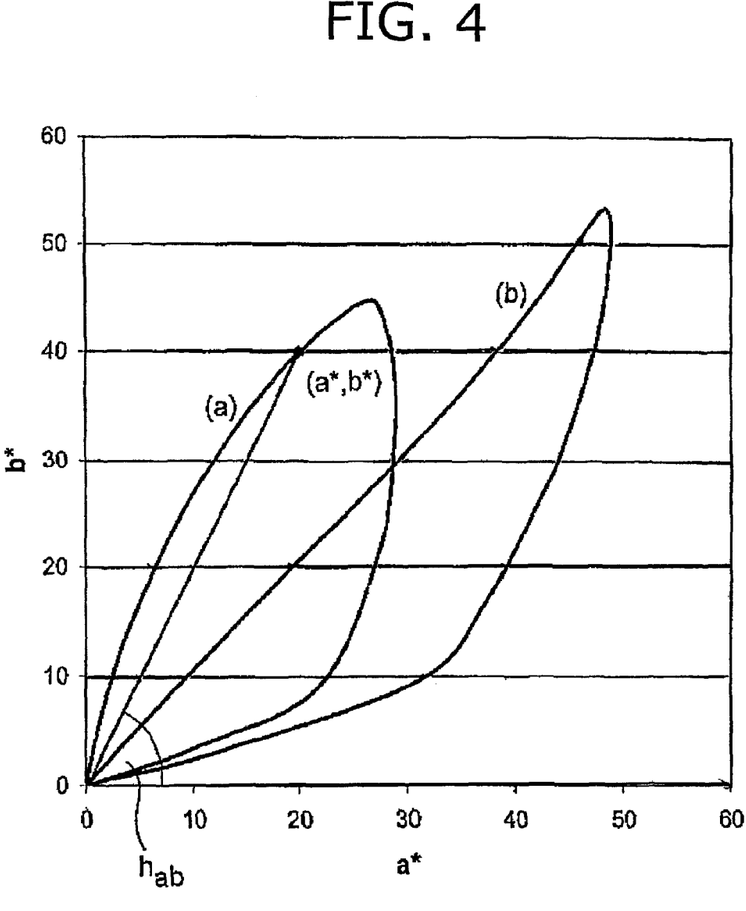
FIG. 4 A plot of the CIELAB a* and b* values derived from the UV/visible absorption spectra of Ex-6 recorded (a) before and (b) after annealing at 1600° C. for 4 hours at a pressure of approximately $6.5 \times 10^9$ Pa (65 kbar)
Figure 5:
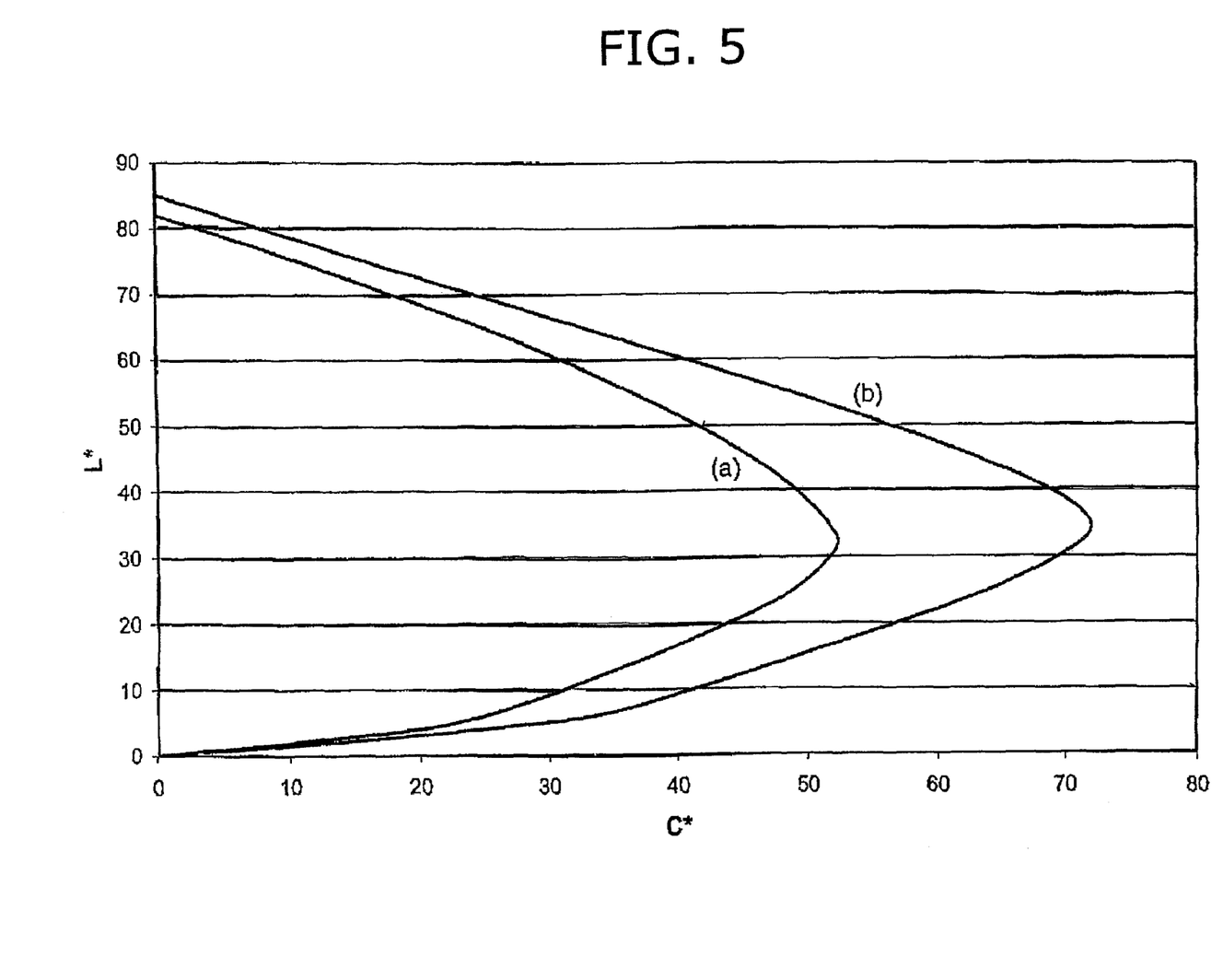
FIG. 5 A plot of the CIELAB L* and C* values derived from the UV/visible absorption spectra of Ex-6 recorded (a) before and (b) after annealing at 1600° C. for 4 hours at a pressure of approximately $6.5 \times 10^9$ Pa (65 kbar)

From the absorbance spectra of this sample measured before and after annealing the CIELAB coordinates of the diamond were derived in the way discussed earlier. They are tabulated below. The dependence of the hue, saturation and lightness on optical path length was modelled in the way described earlier to give an understanding of the colours that can be achieved with different path lengths of the as-grown and annealed diamond. The results are shown in FIGS. 4 and 5, with those for the as-grown and annealed diamond labelled (a) and (b) respectively. Also shown on spectra (a) of FIG. 4 is the means by which the hue angel ($h_{ab}$) is measured, for an arbitrary point (a*,b*) on the curve.

|  | Before annealing | After annealing |
|---|---|---|
| a* | 4.0 | 4.4 |
| b* | 14.5 | 4.8 |
| C* | 15.0 | 6.5 |
| L* | 72 | 81 |
| Hue angle (degrees) | 75 | 47 |

Example 7

A 2.84 mm thick layer of CVD diamond was grown on a type Ib HPHT synthetic diamond substrate in a process similar to that set out in Example 1. Growth conditions consisted of 42/25/600 sccm (standard cubic centimeter per second) of $CH_4/Ar/H_2$ at $330 \times 10^2$ Pa and a substrate temperature of 880° C. with 24 ppm added $N_2$.

The substrate was removed and resulting CVD layer was polished into a rectangular cut CVD gemstone of 1.04 carats which was graded by a professional diamond grader to have a fancy dark orangey brown colour and a quality grade of SI1.

The gemstone was annealed at 1600° C. for four hours under diamond stabilising pressure of approximately $6.5 \times 10^9$ Pa (65 kbar). After this annealing treatment, the gemstone was graded again by the same diamond grader who judged it to have a fancy intense brownish pink colour and a quality grade of SI1.

Example 8

A 1.3 mm thick CVD layer with a very dark brown colour was grown on a {100} HPHT synthetic substrate in a process similar to that set out in Example 1. Growth conditions consisted of 30/25/300 sccm (standard cubic centimeter per second) of $CH_4/Ar/H_2$ at $330 \times 10^2$ Pa and a substrate temperature of 780° C. with 46 ppm added $^{15}N_2$. The nitrogen isotope used was $^{15}N$, which may have displaced lines associated with defects containing N from the values normally obtained with $^{14}N$ because of the mass effect. The substrate was removed and polished slices for annealing experiments were produced from the CVD layer.

The treatment conditions are listed below.

| Slice | Temperature (° C.) | Time | Pressure | Final colour |
|---|---|---|---|---|
| 1 | 1800 | 4 hours | $6.5 \times 10^9$ Pa | Greenish |
| 2 | 1700 | 4 hours | $6.5 \times 10^9$ Pa | Orangish pink |
| 3 | 1500 | 4 hours | Atmospheric | Orangish brown |
| 4 | 1400 | 4 hours | Atmospheric | Brown |
| 5 | 1200 | 4 hours | Atmospheric | Brown |

All of the annealed slices, even those annealed at atmospheric pressure (in argon) at 1200° C., 1400° C. and 1500° C., showed significant increases in transmission in the visible region of the spectrum, with a corresponding increase in their lightness. The absorption spectra of the samples showed various lines as detailed in tables below. In the first table, the descriptions (strong, medium, weak, very weak) give an approximate idea of relative sizes of features in the spectrum. Where no description is given, the relevant feature was not observed. In the second table, "Yes" indicates that the relevant feature was observed.

From these tables it can be seen that diamond that has been grown and annealed by the method of this invention can show absorption lines not seen in as-grown CVD diamond. Many of these lines have not been seen previously for diamond produced in any other way and appear to be unique to diamond produced by the method of this invention. The most obvious examples are marked with asterixes in the tables. Many of these lines can also be seen in photoluminescence.

| Wavelength (nm) | As-grown | 1200° C. | 1400° C. | 1500° C. | 1700° C. | 1800° C. |
|---|---|---|---|---|---|---|
| 270 nm band | Strong | Strong | Strong | Strong | Strong | Strong |
| 365 nm band | Strong | Strong |  |  |  |  |
| 503 |  |  | Weak | Weak | Weak | Weak |

-continued

|  | As-grown | 1200° C. | 1400° C. | 1500° C. | 1700° C. | 1800° C. |
|---|---|---|---|---|---|---|
| 510 nm band | Medium | Medium | Medium | Medium | Medium | Medium |
| 512 | V. weak | Medium | Weak |  |  |  |
| 553 | Weak | Strong | Medium | V. weak |  |  |
| 597 | Medium | Medium | V. weak |  |  |  |
| 624 | Medium | Medium |  |  |  |  |
| 637 | Weak | Weak | Medium | Weak | Medium | V. weak |
| 667* |  | V. weak | Medium | Weak | Weak | V. weak |
| 684* |  | Weak | Weak | Weak | Weak | V. weak |
| 713 | V. weak | Medium | Medium | Medium | Weak |  |
| 781* |  | Medium | Medium | Medium | Medium | Weak |
| 851* |  | V. weak | Weak | Medium | Strong | Strong |
| 1000 band | Strong | Strong | Strong | Strong | Strong | Medium |
| 1263* |  |  |  | Medium | Medium | Medium |
| 1281* |  |  |  | Medium | Medium | Medium |
| 1359 | Strong | Strong | Strong | Medium | Weak | Weak |
| 1556 | Medium | Medium | Medium | Weak | Weak | V. weak |
| Wavenumbers (cm$^{-1}$) |  |  |  |  |  |  |
| 1332 | Yes | Yes | Yes | Yes | Yes | Yes |
| 1340* |  | Yes | Yes | Yes | Yes | Yes |
| 1344 | Yes | Yes | Yes | Yes | Yes | Yes |
| 1353 | Yes | Yes | Yes | Yes | Yes | Yes |
| 1362 | Yes | Yes | Yes | Yes | Yes | Yes |
| 1371 | Yes | Yes | Yes | Yes | Yes | Yes |
| 1374* |  |  |  |  | Yes | Yes |
| 1378* |  |  |  |  | Yes | Yes |
| 1384* |  |  |  |  | Yes | Yes |
| 1396* |  |  |  | Yes | Yes | Yes |
| 1405 |  |  |  |  | Yes | Yes |
| 1453* |  |  |  |  | Yes | Yes |
| 2695 | Yes | Yes | Yes | Yes | Yes | Yes |
| 2727 | Yes | Yes | Yes | Yes | Yes | Yes |
| 2807 | Yes | Yes | Yes | Yes | Yes | Yes |
| General CH modes | Yes | Yes | Yes | Yes | Yes | Yes |
| 2949 |  | Yes | Yes | Yes | Yes | Yes |
| 3031 |  | Yes | Yes | Yes | Yes | Yes |
| 3054 | Yes | Yes | Yes | Yes | Yes |  |
| 3107 |  |  |  |  |  | Yes |
| 3124 | Yes | Yes | Yes | Yes | Yes | Yes |
| 3310* |  |  |  | Yes | Yes | Yes |
| 3323 | Yes |  |  |  |  |  |
| 4677* |  |  |  | Yes | Yes | Yes |

We claim:

1. A method of producing single crystal CVD synthetic diamond material, the method comprising:
   providing a brown single crystal CVD synthetic diamond wherein the single crystal CVD synthetic diamond has a concentration of nitrogen in the solid diamond of 0.05 to 50 ppm;
   heat treating the single crystal CVD synthetic diamond in a temperature range of 1200° C. to 2500° C. in an inert or stabilising atmosphere to produce another and desirable colour in the single crystal CVD diamond, wherein the heat treatment is performed in an inert or stabilizing atmosphere at a pressure in the graphite stable region; and
   controlling the temperature and a time period of the heat treatment to prevent significant graphitization.

2. A method according to claim 1, wherein the pressure is in the range $1\times10^2$ Pa to $5\times10^5$ Pa.

3. A method according to claim 1 or claim 2, wherein the pressure is in the range $1\times10^2$ Pa to $1\times10^5$ Pa, atmospheric pressure, or in the range $1.02\times10^5$ Pa to $5\times10^5$ Pa.

4. A method according to claim 1, wherein the pressure is in the range $5\times10^5$ Pa up to diamond stabilizing pressure.

5. A method according to claim 1, wherein the time period of the heat treatment is in the range 3 seconds to $3\times10^6$ seconds.

6. A method according to claim 5, wherein the time period has an upper bound of $3\times10^5$ seconds, $1\times10^5$ seconds, $2\times10^4$ seconds, or $7\times10^3$ seconds.

7. A method according to claim 5, wherein the time period has a lower bound of 30 seconds, 100 seconds, or 300 seconds.

8. A method according to claim 1, wherein the colour of the CVD synthetic diamond after heat treatment is fancy.

9. A method according to claim 1, wherein the dominant colour of the CVD synthetic diamond after the heat treatment is other than brown.

10. A method according to claim 1, wherein the colour of the CVD synthetic diamond after heat treatment is in the range pink-green.

11. A method according to claim 10, wherein the colour of the CVD synthetic diamond after heat treatment is pink.

12. A method according to claim 1, wherein the colour of the CVD diamond after heat treatment is colourless.

13. A method according to claim 1, wherein the colour of the CVD synthetic diamond after heat treatment is near colourless.

14. A single crystal CVD synthetic diamond produced by a method according to claim 1.

* * * * *